US012813210B2

(12) United States Patent
Lee et al.

(10) Patent No.: US 12,813,210 B2
(45) Date of Patent: Nov. 24, 2026

(54) APPARATUS AND METHOD OF TRANSFERRING ARTICLE

(71) Applicant: SEMES CO., LTD., Chungcheongnam-do (KR)

(72) Inventors: Hyun Jun Lee, Seoul (KR); Jae Hee Hwang, Seongnam-si (KR); Seon Jung Kim, Cheonan-si (KR); Tae Hyun Jo, Cheonan-si (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 416 days.

(21) Appl. No.: 18/541,045

(22) Filed: Dec. 15, 2023

(65) Prior Publication Data

US 2024/0199348 A1 Jun. 20, 2024

(30) Foreign Application Priority Data

Dec. 19, 2022 (KR) ........................ 10-2022-0178447

(51) Int. Cl.
*H10P 72/30* (2026.01)

(52) U.S. Cl.
CPC ...... *H10P 72/3221* (2026.01); *H10P 72/3218* (2026.01); *H10P 72/3222* (2026.01); (Continued)

(58) Field of Classification Search
CPC ............. H10P 72/3218; H10P 72/3221; H10P 72/3222; B65G 2201/0297; B65G 2203/0233
See application file for complete search history.

(56) References Cited

U.S. PATENT DOCUMENTS

| | | | | |
|---|---|---|---|---|
| 6,851,913 B2 * | 2/2005 | Iizuka | ................. | H10P 72/3216 414/940 |
| 7,210,589 B2 * | 5/2007 | Iizuka | ................. | H10P 72/3218 212/331 |

(Continued)

FOREIGN PATENT DOCUMENTS

| | | | | |
|---|---|---|---|---|
| JP | 2010126278 A | * | 6/2010 | |
| KR | 20170000059 A | * | 1/2017 | ....... H01L 21/67303 |

(Continued)

OTHER PUBLICATIONS

Korean Office Action issued in corresponding KR Patent Application No. 10-2022-0178447, dated Jun. 24, 2024, with English translation.

*Primary Examiner* — Gene O Crawford
*Assistant Examiner* — Keith R Campbell
(74) *Attorney, Agent, or Firm* — Carter, DeLuca & Farrell LLP

(57) ABSTRACT

Disclosed is an apparatus for transferring an article, the apparatus including: a vehicle moving along a moving rail installed on a ceiling; a main body connected to the vehicle and providing an interior space in which an article is located; a hoist module provided in the main body, and for hoisting a belt by winding or unwinding the belt; a hand unit fixed at one end of the belt and for gripping the article; and a drop preventing member provided in the main body, and for preventing the article from dropping during moving of the vehicle, in which the drop preventing member includes support pins provided at different heights depending on types of article.

12 Claims, 17 Drawing Sheets

(52) U.S. Cl.
CPC ................ *B65G 2201/0297* (2013.01); *B65G 2203/0233* (2013.01)

(56) References Cited

U.S. PATENT DOCUMENTS

| | | | | |
|---|---|---|---|---|
| 9,938,120 | B2 * | 4/2018 | Tomida | B66C 13/18 |
| 11,084,505 | B2 * | 8/2021 | Kobayashi | B61B 3/02 |
| 11,276,597 | B2 * | 3/2022 | Kobayashi | B61B 12/00 |
| 11,643,272 | B2 * | 5/2023 | Abe | B65G 1/0457<br>414/281 |
| 12,139,342 | B2 * | 11/2024 | Tomida | B65G 17/20 |
| 2024/0083689 | A1 * | 3/2024 | Nishikawa | B65G 43/00 |
| 2025/0187852 | A1 * | 6/2025 | Park | B65G 35/06 |

FOREIGN PATENT DOCUMENTS

| | | | |
|---|---|---|---|
| KR | 10-2391958 | A | 4/2022 |
| KR | 10-2022-0088576 | A | 6/2022 |
| KR | 10-2422206 | A | 7/2022 |

* cited by examiner

512: 512a, 512b

514: 514a, 514b

510: 512, 514

512: 512a, 512b

514: 514a, 514b

510: 512, 514

512: 512a, 512b

514: 514a, 514b

510: 512, 514

APPARATUS AND METHOD OF TRANSFERRING ARTICLE

CROSS-REFERENCE TO RELATED APPLICATIONS

This application claims priority to and the benefit of Korean Patent Application No. 10-2022-0178447 filed in the Korean Intellectual Property Office on Dec. 19, 2022, the entire contents of which are incorporated herein by reference.

TECHNICAL FIELD

The present invention relates to an apparatus and a method of transferring an article.

BACKGROUND ART

In general, in order to manufacture a semiconductor device, various types of processes, such as deposition, photography, and etching, are performed, and devices performing each of these processes are arranged in a semiconductor manufacturing line. Objects, such as wafers or masks, for performing a semiconductor device manufacturing process may be provided to each semiconductor process device in a state of being accommodated in a container. Additionally, the processed objects may be transferred in the state of being container in the container.

The container is transferred by the Overhead Hoist Transport (hereinafter, referred to as a container transferring device). The container transferring device transfers a container containing an object to a load port of one of the semiconductor process devices. The container transferring device may also pick up the container containing the processed object from the load port and transfer the container to the outside, or transfer the container to another one of the semiconductor process devices.

The container transferring device is designed to transfer one type of container. In order for the container transferring device to transfer containers of different sizes, the set position of the drop preventing body needs be changed according to the size of the container.

SUMMARY OF THE INVENTION

The present invention has been made in an effort to provide an article transferring apparatus and an article transferring method capable of transferring an article of a different size.

The present invention has also been made in an effort to provide an article transferring apparatus and an article transferring method capable of solving problems that may occur in a process of transferring heterogeneous articles through an interlock device.

The object of the present invention is not limited thereto, and other objects not mentioned will be clearly understood by those of ordinary skill in the art from the following description.

An aspect of the present invention provides an apparatus for transferring an article, the apparatus including: a vehicle moving along a moving rail installed on a ceiling; a main body connected to the vehicle and providing an interior space in which an article is located; a hoist module provided in the main body, and for hoisting a belt by winding or unwinding the belt; a hand unit fixed at one end of the belt and for gripping the article; and a drop preventing member provided in the main body, and for preventing the article from dropping during moving of the vehicle, in which the drop preventing member includes support pins provided at different heights depending on types of article.

Further, the drop preventing member may further include a plate on which the support pins are installed, and the support pins may include: first support pins supporting a first article; and second support pins for supporting a second article and a third article with a larger area than the first article, and the first support pins have lower heights than the second support pins.

Further, the second support pins may have inclined surfaces that align the first article when the first article is coupled to the first support pins.

Further, the apparatus may further include: a first detection unit provided in the main body and detecting the article; and a control unit for determining a type of article according to a detection signal of the first detection unit.

Further, the first detection unit may detect the article at a home position where the article waits for a period of time before the hoist module seats the article on the drop preventing member.

Further, the first detection unit may include: a first sensor for detecting the article at a first height; a second sensor for detecting the article at a second height lower than the first height, and the control unit may determine the article as a first article when the first sensor and the second sensor do not detect the article, determine the article as a third article when the first sensor and the second sensor detect the article, and determine the article as a second article when the first sensor detects the article and the second sensor does not detect the article.

Further, the control unit may control a descending motion of the hoist module so that a descending distance of the hand unit varies depending on the type of article.

Further, when the article is determined as the first article, the control unit descends the hand unit by a first height, when the article is determined as the second article, the control unit descends the hand unit by a second height, and when the article is determined as the third article, the control unit descends the hand unit by a third height.

Further, the apparatus may further include a second detection unit for detecting a descending height of the hand unit, in which the second detection unit may include: a dog bar provided to be moved with the hand unit; a first sensor for detecting the dog bar when the hand unit is moved by the first height; a second sensor for detecting the dog bar when the hand unit is moved by the second height; and a third sensor for detecting the dog bar when the hand unit is moved by the third height.

Further, the apparatus may further include a third detection unit for detecting whether a gripper of the hand unit is gripping a flange of the article.

Another aspect of the present invention provides a method of transferring an article, the method including: (a) when a hand unit grips an article located in a storage place, hoisting the article to a home position of a main body by a hoist module connected with the hand unit; (b) in a state where the article located at the home position of the main body, moving a drop preventing member to a position for preventing the article from dropping; and (c) placing the article located at the home position of the main body on the drop preventing member, in which in the operation (c), the article is placed to be supported on at least one of first support pins and second support pins of the drop preventing member, the first support pins and the second support pins supporting the article at different heights.

Further, the method may further include an article determining operation for detecting the article located at the home position of the main body and determining a type of article, before the operation (b) or the operation (c).

Further, the article determining operation may include determining three types of article based on whether a first sensor detecting an article at a first height and a second sensor detecting an article at a second height lower than the first height detect the article, and when the first sensor and the second sensor do not detect the article, the article may be determined as a first article, when the first sensor and the second sensor detect the article, the article may be determined as a third article, and when the first sensor detects the article and the second sensor does not detect the article, the article may be determined as a second article.

Further, the operation (c) may include controlling a descending motion of the hoist module so that a descending distance of the hand unit varies depending on the type of article determined in the article determining operation.

Further, the operation (c) may include: when the article is determined as the first article, descending the hand unit by a first height, when the article is determined as the second article, descending the hand unit by a second height, and when the article is determined as the third article, descending the hand unit by a third height.

Further, the operation (c) may further include detecting a descending height of the hand unit.

Further, the method may further include detecting whether a gripper of the hand unit properly grips a flange of the article in the operation (a).

Still another aspect of the present invention provides an apparatus for of transferring an article, the apparatus including: a vehicle moving along a moving rail installed on a ceiling; a main body connected to the vehicle and providing an interior space in which an article is located; a hoist module provided in the main body, and for hoisting a belt by winding or unwinding the belt; a hand unit fixed at one end of the belt and for gripping the article; and a drop preventing member provided in the main body, and for preventing the article from dropping during moving of the vehicle; a first detection unit provided in the main body and for detecting an article; and a control unit for determining a type of article according to a detection signal of the first detection unit, in which the drop preventing member may include: a plate positioned in a lower portion of the interior space by a driving unit; first support pins provided on the plate and supporting a first article; and second support pins provided on the plate, supporting a second article and a third article with a larger area than the first article, and having higher heights than the first support pins, and the first detection unit detects the article at a home position where the article waits for a period of time before the hoist module seats the article on the drop preventing member.

Further, the second support pins may have inclined surfaces that align the first article when the first article is coupled to the first support pins, and the first detection unit may include: a first sensor for detecting the article at a first height; a second sensor for detecting the article at a second height lower than the first height, and the control unit may determine the article as a first article when the first sensor and the second sensor do not detect the article, determine the article as a third article when the first sensor and the second sensor detect the article, and determine the article as a second article when the first sensor detects the article and the second sensor does not detect the article.

Further, the control unit may control a descending motion of the hoist module so that a descending distance of the hand unit varies depending on the type of article, and the apparatus may further include: a second detection unit for detecting a descending height of the hand unit; and a third detection unit for detecting whether a gripper of the hand unit is gripping a flange of the article.

DETAILED DESCRIPTION

Figure 1:
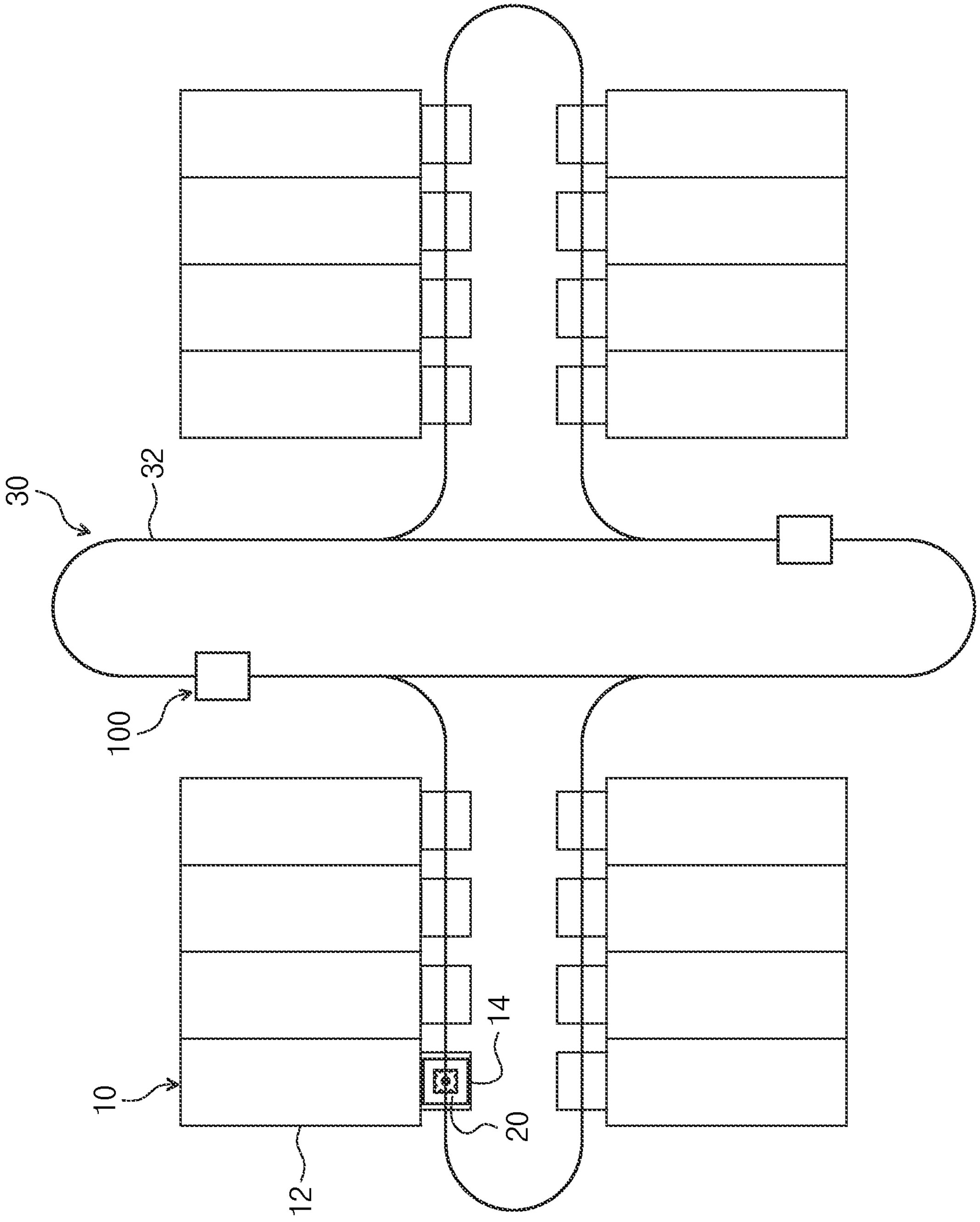
FIG. 1 is a top plan view of a transferring facility provided with an article transferring apparatus.

Example embodiments will now be described more fully with reference to the accompanying drawings. Example embodiments are provided so that this disclosure will be thorough and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

When the term "same" or "identical" is used in the description of example embodiments, it should be understood that some imprecisions may exist. Thus, when one element or value is referred to as being the same as another element or value, it should be understood that the element or value is the same as the other element or value within a manufacturing or operational tolerance range (e.g., ±10%).

When the terms "about" or "substantially" are used in connection with a numerical value, it should be understood that the associated numerical value includes a manufacturing or operational tolerance (e.g., ±10%) around the stated numerical value. Moreover, when the words "generally" and "substantially" are used in connection with a geometric shape, it should be understood that the precision of the geometric shape is not required but that latitude for the shape is within the scope of the disclosure.

Unless otherwise defined, all terms (including technical and scientific terms) used herein have the same meaning as commonly understood by one of ordinary skill in the art to which example embodiments belong. It will be further understood that terms, including those defined in commonly used dictionaries, should be interpreted as having a meaning that is consistent with their meaning in the context of the relevant art and will not be interpreted in an idealized or overly formal sense unless expressly so defined herein.

Figure 2:
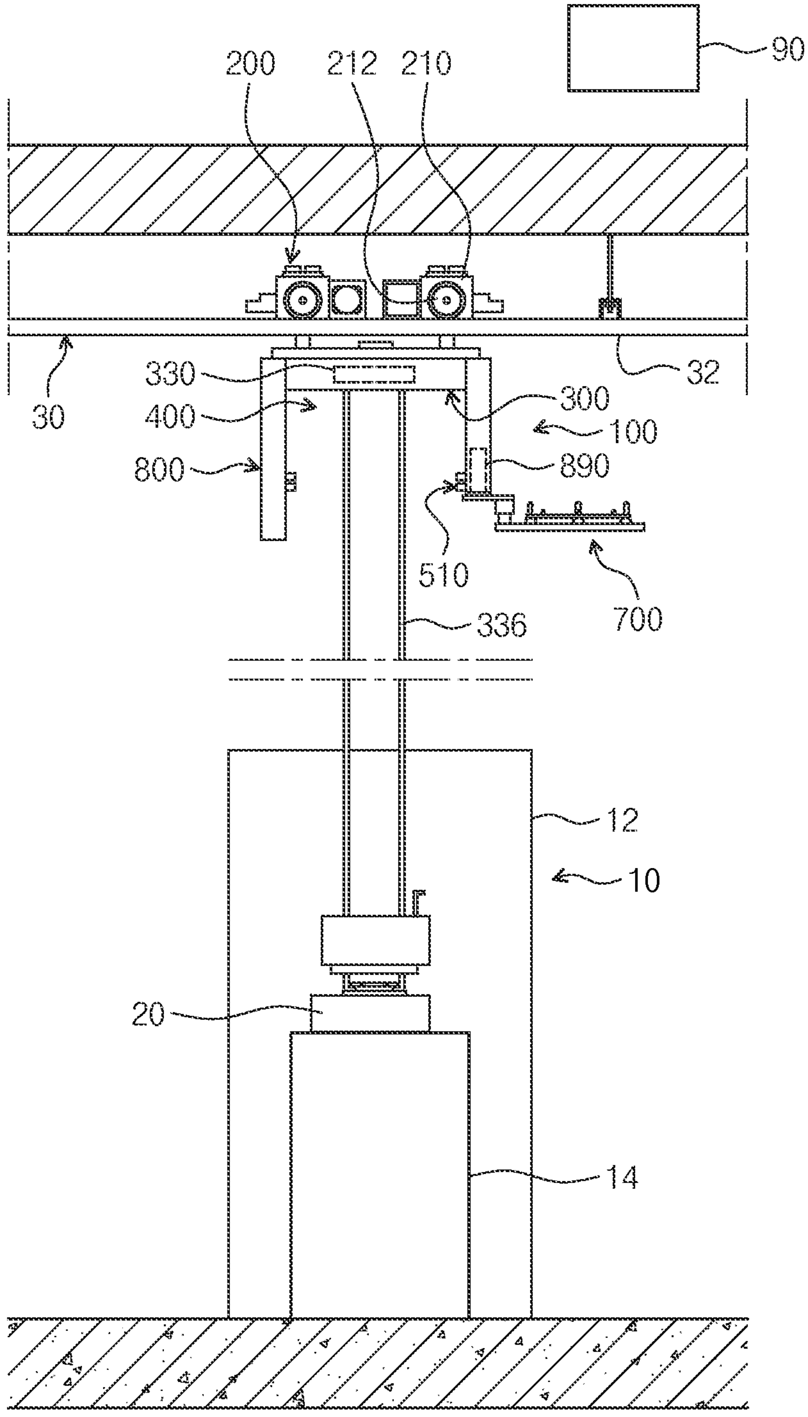
FIG. 2 is a side view of the article transferring apparatus which receives and hand overs an article to a loading place.

FIG. 1 is a top plan view of a transferring facility provided with an article transferring apparatus, and FIG. 2 is a side view of the article transferring apparatus which receives and hand overs an article to a loading place.

As illustrated in FIGS. 1 and 2, an article transferring apparatus 100 may include a transferring vehicle for transferring an article 20 to a transfer destination place 10.

In the present exemplary embodiment, the article transferring apparatus 100 transfers the article 20 to the transfer destination place 10 in a transferring facility having a plurality of transferring destination places 10. The article 20 is an object to be transferred, and may be, for example, a single article or a combination of multiple articles, such as a received object and a container for receiving the received article. In the present exemplary embodiment, the article 20 may be a container (Mask SMIF POD) that receives a photomask. Different types of mask SMIF POD include RSP-150, RSP-200, and EUV-POD, depending on their size.

The article transferring apparatus 100 may transfer articles of various sizes. As illustrated in FIGS. 5A to 5C, the article 20 that may be transferred by the article transferring apparatus may include a small article (a first article) 21, a large article (second article, third article) 22 and 23 that are larger in volume than the small article 21. In the present exemplary embodiment, the first article 21 may be an RSP-150. The second article 22 may be an RSP-200. Further, the third article 22 may be a EUV-POD. However, the article 20 is not limited thereto, and may be a substrate accommodating container, such as a Front Opening Unified Pod (FOUP) in which a plurality of substrates is accommodated.

In the present exemplary embodiment, the transferring destination place 10 may include a processing device 12 and a loading place 14 for the article 20 to be loaded. For example, the processing device 12 may be a device that processes the semiconductor substrate and/or processes the photomask by withdrawing the photomask from the article 20 located at the loading place 14. As illustrated in FIG. 1, a plurality of transferring destination places 10 is provided in the transferring facility. For example, a transferring path 30 is provided in the transferring facility so as to pass through the plurality of transferring destination places 10.

The transferring path 30 may be defined by a moving rail 32 connected to the ceiling. Further, the loading place 14 may be installed below the moving rail 32 and overlapping the moving rail 32 in top plan view (see FIG. 1). Referring to FIG. 1, the moving rail 32 may include a straight section and a curved section.

In the present exemplary embodiment, the article transferring apparatus 100 may be an Overhead Hoist Transport (OHT) device. The article transferring apparatus 1000 may travel the moving rail 32 to transfer the article 20 to the transferring destination place 10. In the present exemplary embodiment, the plurality of the article transferring apparatuses 100 is provided in the transferring facility. Further, as illustrated in FIG. 2, the article transferring apparatus 100 is capable of transferring the article and transferring the article 20 to the loading place 14. In other words, the article transferring apparatus 100 may lower the article 20 from a height (the height of the moving rails 32) at which the article transferring apparatus 100 is disposed, toward the loading place 14 that is installed below the article transferring apparatus 100, and load the article 20 in the loading place 14.

Hereinafter, the present invention will be described based on the case where the article transferring apparatus 100 transfers a container containing a photomask to semiconductor process devices disposed on a semiconductor manufacturing line. However, the present invention is not limited thereto, and the article transferring apparatus of the present exemplary embodiment may be equally or similarly applied to various manufacturing lines requiring transferring of articles and/or containers in which articles are accommodated.

Figure 3:
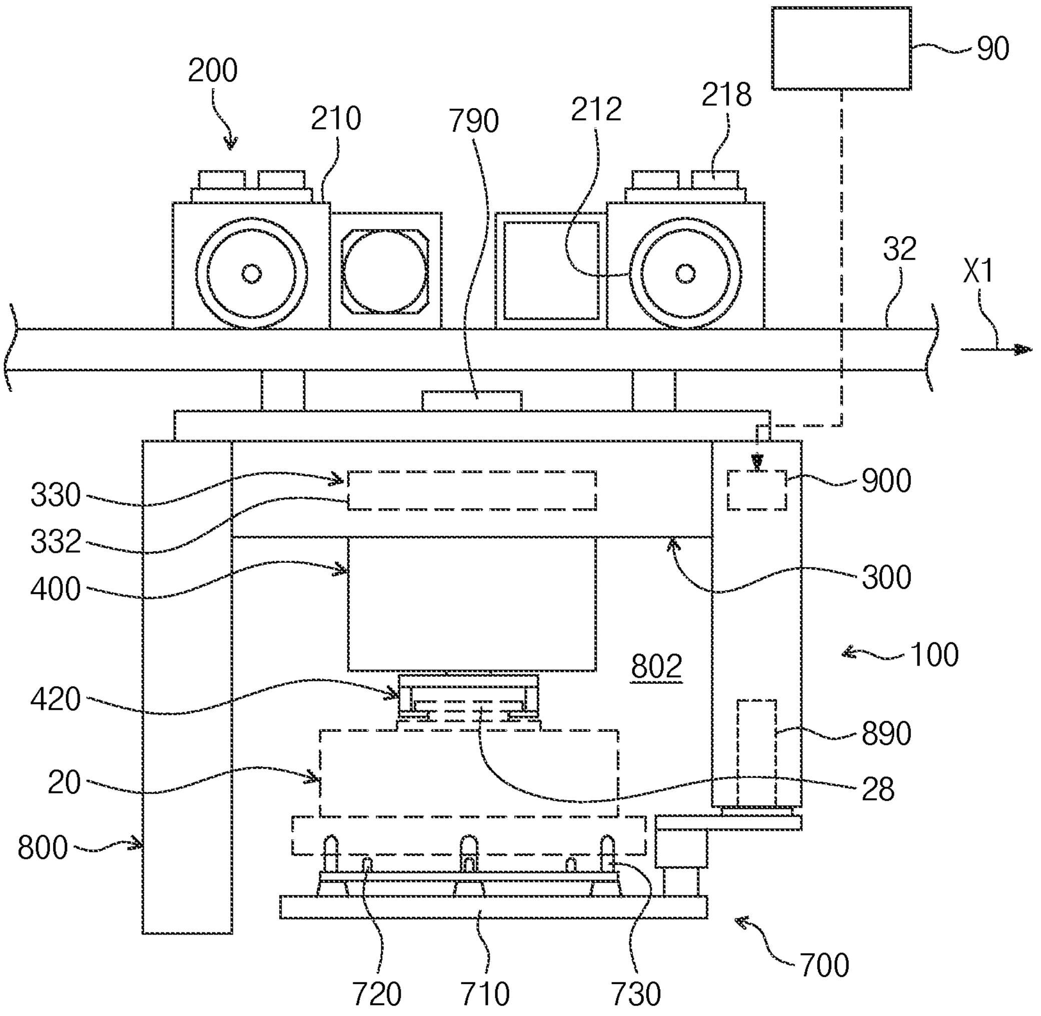
FIGS. 3 and 4 are diagrams illustrating the article transferring apparatus.
Figure 4:
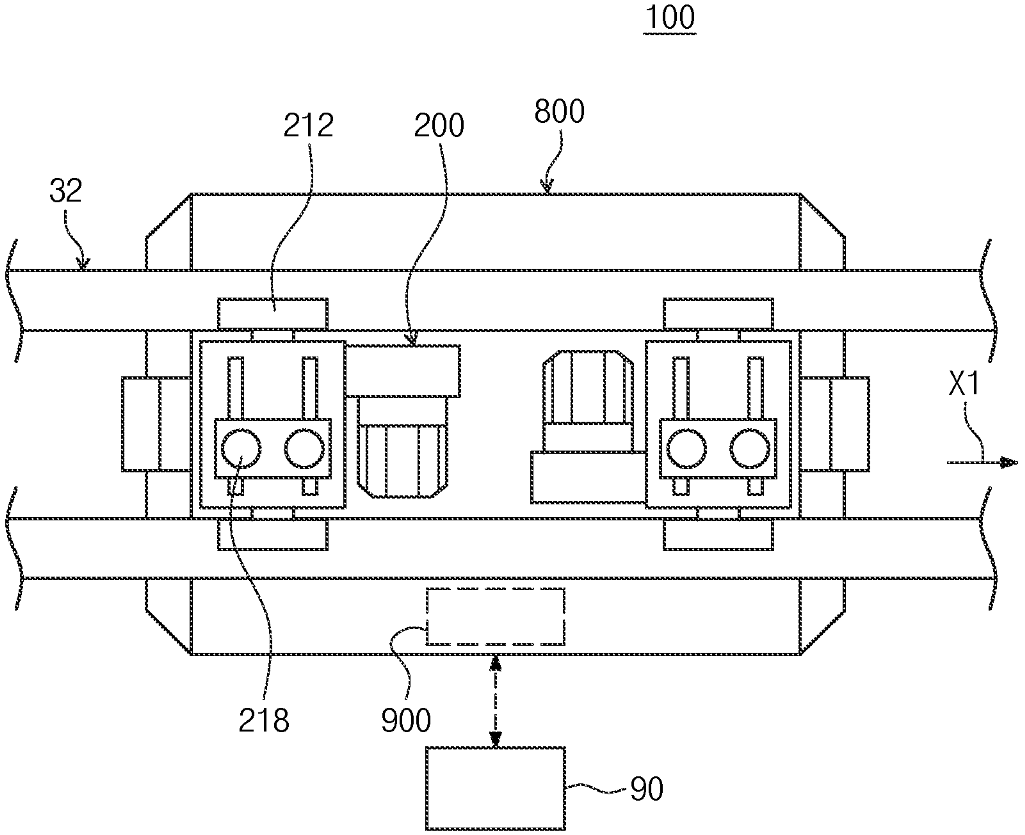

FIGS. 3 and 4 are diagrams illustrating the article transferring apparatus.

As illustrated in FIGS. 2 to 4, the article transferring apparatus 100 transfers a container 20 (referred to as an article). In the exemplary embodiment, the article transferring apparatus 100 transfers the article 20 in a suspended state.

In the present exemplary embodiment, the article transferring apparatus 100 may be a transferring vehicle including a vehicle 200, a vehicle main body 800, a hoist module 300, a hand unit 400, a drop preventing member 700, a first detection unit 510, a second detection unit 520, a third detection unit 530, and a control unit 900.

The vehicle 200 is a moving module that travels along the moving rail 32 provided along the ceiling of a semiconductor manufacturing line by a separate driving unit. The vehicle 200 may include a body 210 having driving wheels 212 on both sides. An actuator (for example, a driving motor) for rotating the driving wheel 212 may be provided in the body 210. The body 210 travels along the moving rail 32. Specifically, the body 210 may travel while the travel wheels 212 rotate in a state of being in contact with the moving rail 32. Meanwhile, a top surface of the body 210 may be provided with a steering wheel 218. The steering wheel 218 is configured to be movable along a horizontal direction perpendicular to the direction of travel of the body 210. For example, the steering wheel 218 may move in a left and right direction of the body 210. The steering wheel 218 may selectively contact a straight steering rail (not illustrated) to guide straight driving and a diverging steering rail (not illustrated) to guide diverging driving.

The vehicle main body 800 is connected to the vehicle 200 below the moving rail 32. The upper side of the vehicle main body 800 may be connected to the lower side of the vehicle 200 by at least one connection part. The vehicle main body 800 provides an interior space 802 in which the article 20 is located.

The vehicle main body 800 may be formed to have a structure having open both sides and lower side to allow the article 20 to be moved in the left-right direction and in a downward direction in the interior space 802. Here, both sides may be perpendicular to the moving direction of the article transferring apparatus 100.

For example, the hoist module 300 may load and unload the article 20. The hoist module 300 unloads the article 20 from the loading place to the interior space 802, or loads the article 20 from the interior space 802 to the loading place. The article 20 is transferred through the open bottom surface of the vehicle main body 800. The hoist module 300 may be provided in the vehicle main body 800. The hoist module 300 includes a hoisting unit 330 for hoisting the hand unit 400.

The hoisting unit 330 moves the hand unit 400 in an up and down direction. The hosting unit 330 may include a driving unit 332 and a hosting belt 336. The hosting belt 336 of the hosting unit 330 may be connected to the hand unit 400. The hosting belt 336 may move the hand unit 400 in an upward and downward direction by a driving force generated by the driving unit 332. For example, the driving unit 332 may generate driving force to wind or unwind the hoisting belt 336 to move the hand unit 400 in the upward or downward direction. However, the present invention is not limited thereto, and the hosting unit 330 may be modified into a variety of known devices that can hoist the hand unit 400.

he hand unit 400 is coupled to the hoist module 300. The hand unit 400 may be connected to the hoist module 300 through the plurality of hosting belts 336 and may include a gripper 420 for gripping the article 20. Additionally, the article 20 may include a flange 28 configured to be gripped by the gripper 420. The gripper 420 grips or ungrips the flange 28 of the article 20. Although not illustrated, the hand unit 400 may include a gripper driving unit (not illustrated) for driving the gripper 420. For example, the gripper driving unit may operate the gripper 420 by using a cam plate and a cam follower, and may also include a motor, a ball screw, and the like for moving the cam plate. However, the configuration of the hand unit 400 itself may be varied, and the scope of the present invention will not be limited thereby.

The drop preventing member 700 is provided in the vehicle main body 800. The drop preventing member 700 prevents the drop of the article 20 during moving of the vehicle 200. For example, even when the article is in danger of being abnormally dropped, for example, when the hand unit abnormally releases its grip on the article, the drop preventing member 700 also serves to prevent the drop of the article.

Figure 5:
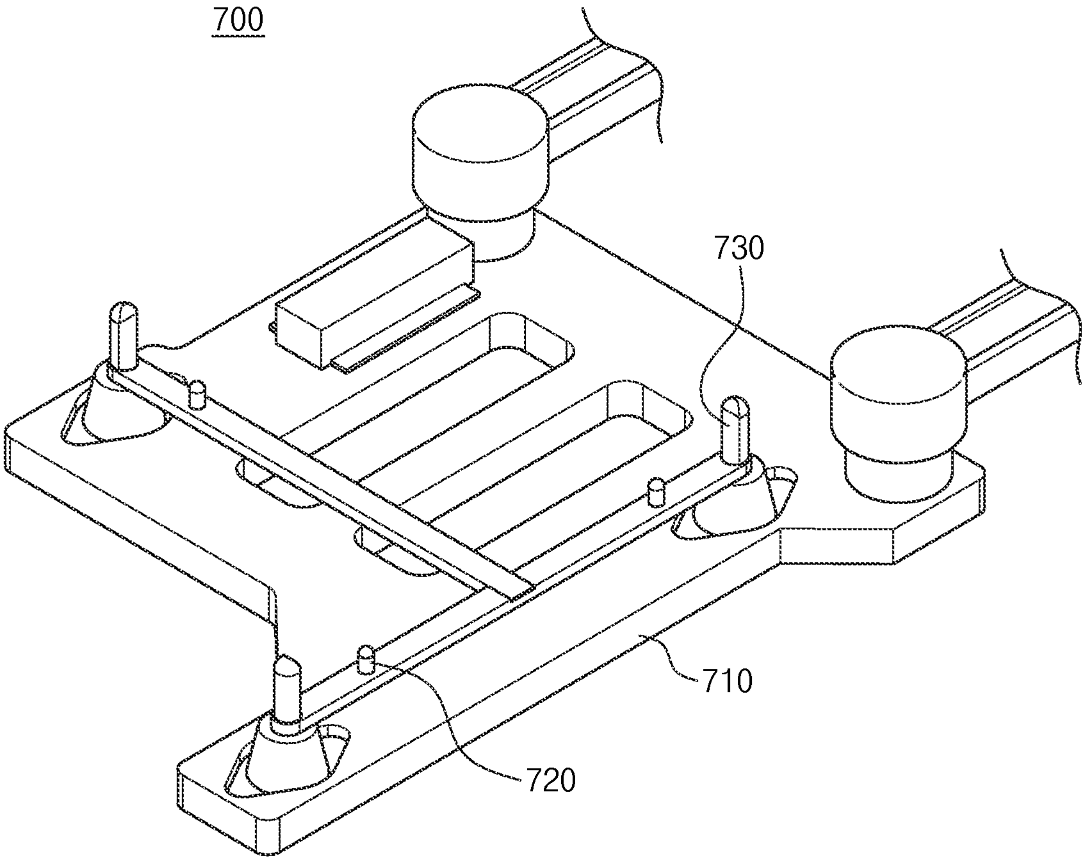
FIG. 5 is a perspective view for illustrating a drop preventing member.
Figure 6:
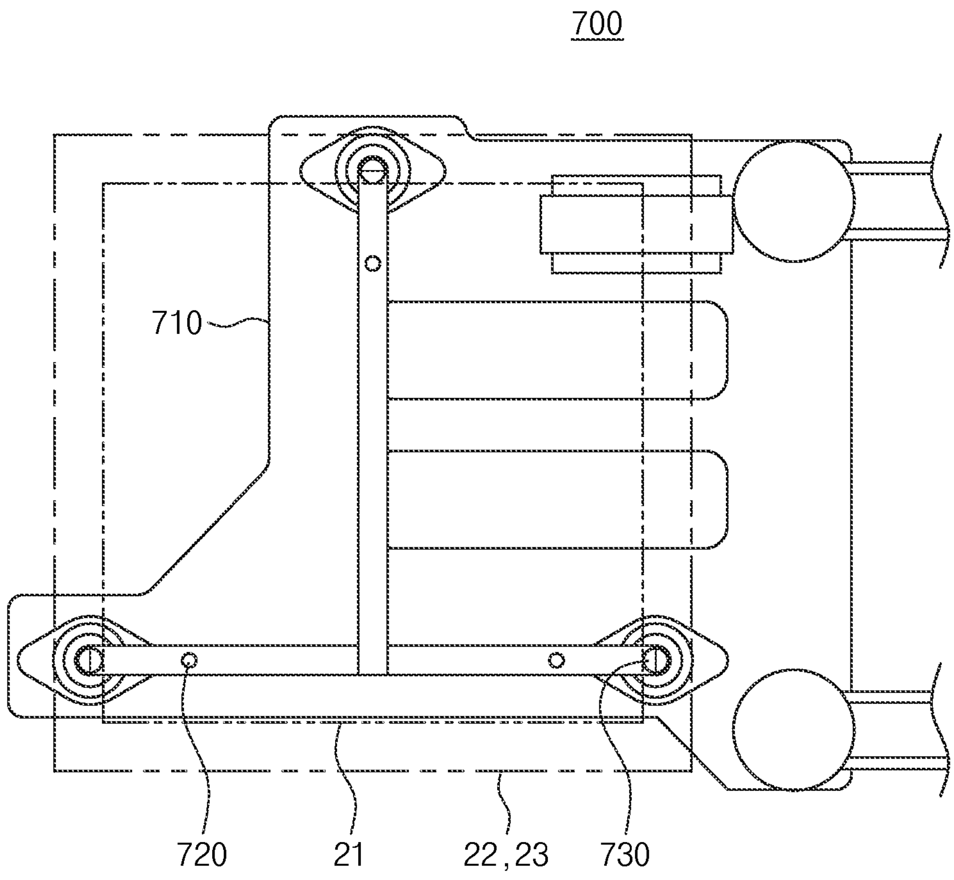
FIG. 6 is a top view of the drop preventing member illustrated in FIG. 5.

FIG. 5 is a perspective view for illustrating the drop preventing member, and FIG. 6 is a top view of the drop preventing member illustrated in FIG. 5.

Referring to FIGS. 4 to 6, the drop preventing member 700 may include a plate 710 that is horizontally movable toward the bottom surface of the article 20, and support pins 720 and 730 provided on the plate 710. Horizontal movement of the plate 710 may be provided by a drive unit 890 installed in the vehicle main body 800. The drop preventing member 700 may be rotated by the driving unit 890 to a closed position to prevent the drop of the article 20 and an open position to allow the article 20 to be loaded and unloaded. For reference, FIG. 2 illustrates the drop preventing member 700 in the open position, and FIG. 3 illustrates the drop preventing member 700 in the closed position.

The support pins 720 and 730 are provided to regulate the horizontal movement of the article 20. The support pins 720 and 730 may restrict the article 20 from being moved in the front and rear direction or transverse width direction beyond a set range. The support pins 720 and 730 may include a first support pin 720 and a second support pin 730.

The first support pins 720 may be provided on the plate 710 to support the first article 21. The second support pins 730 may be provided on the plate 710 to support the second article 22. Heights of the second support pins 730 may be treater than heights of the first support pins 720.

Figure 7A:
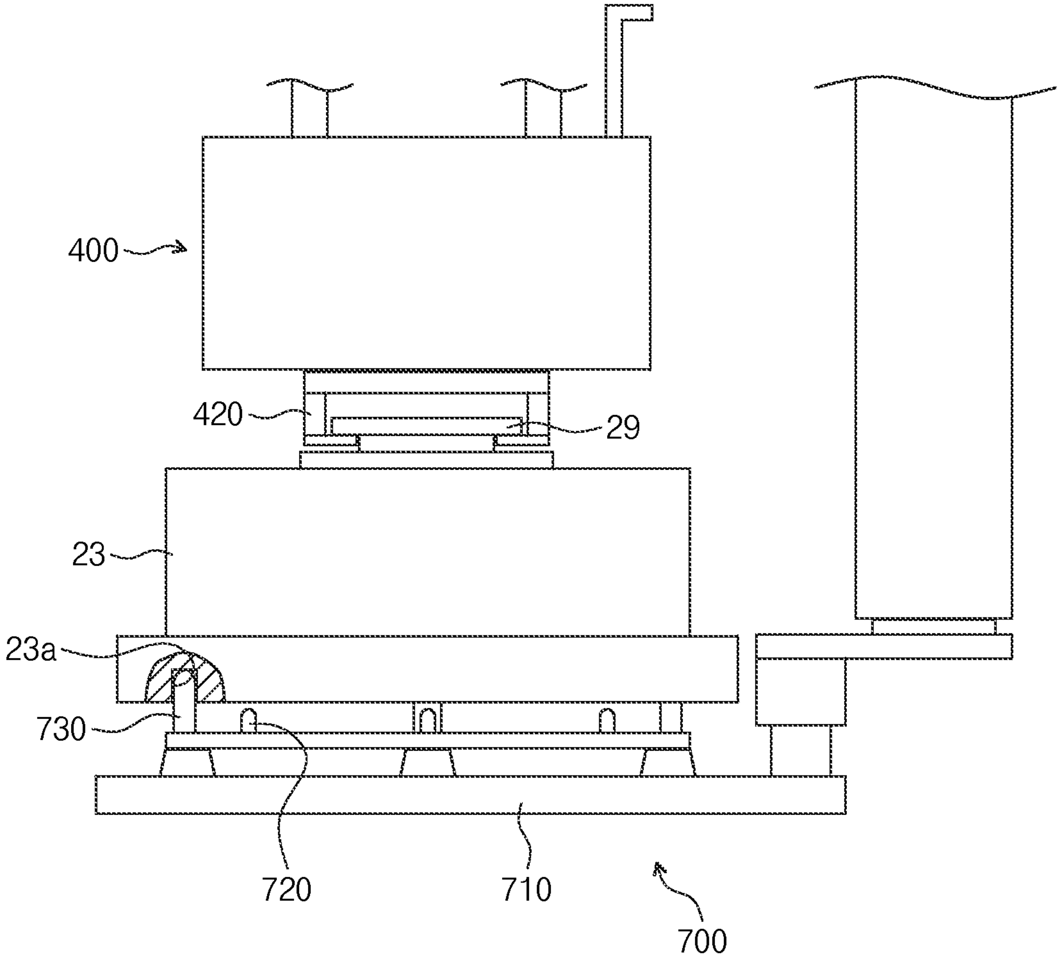
FIGS. 7A to 7C are diagrams illustrating the state where each of first to third articles to be transferred are placed on the drop preventing member.
Figure 7B:
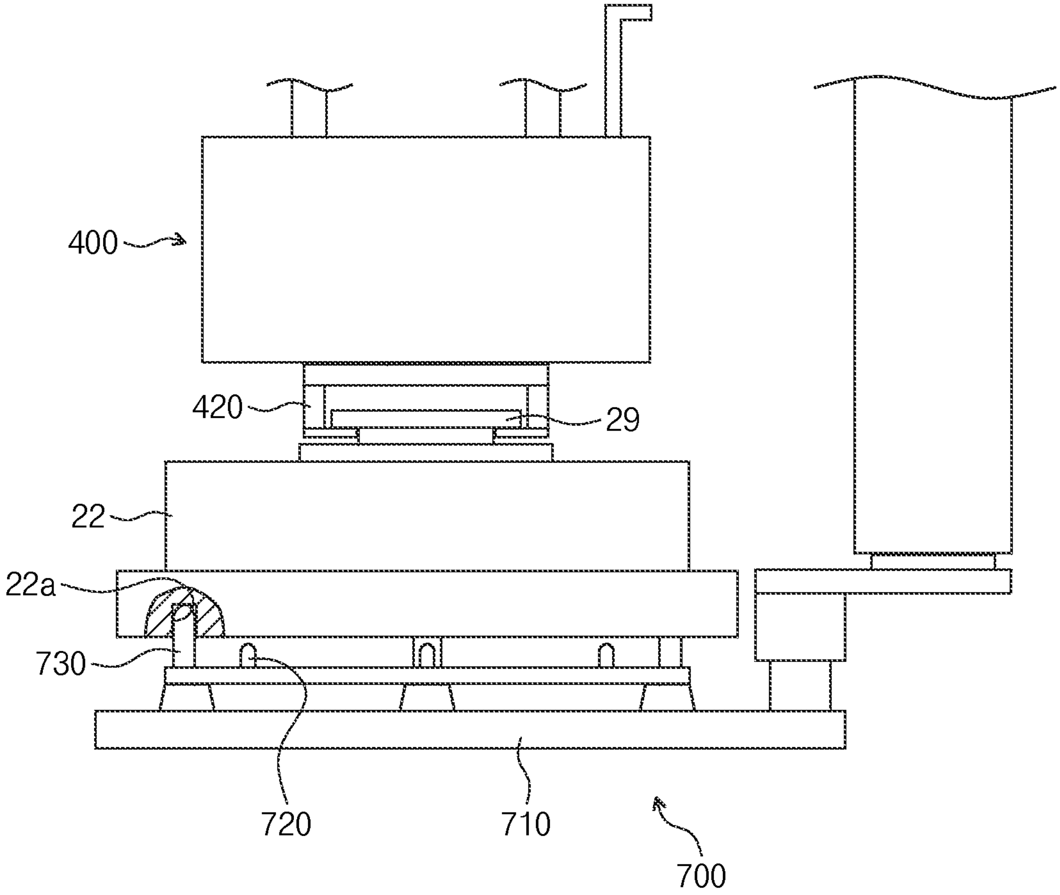
Figure 7C:
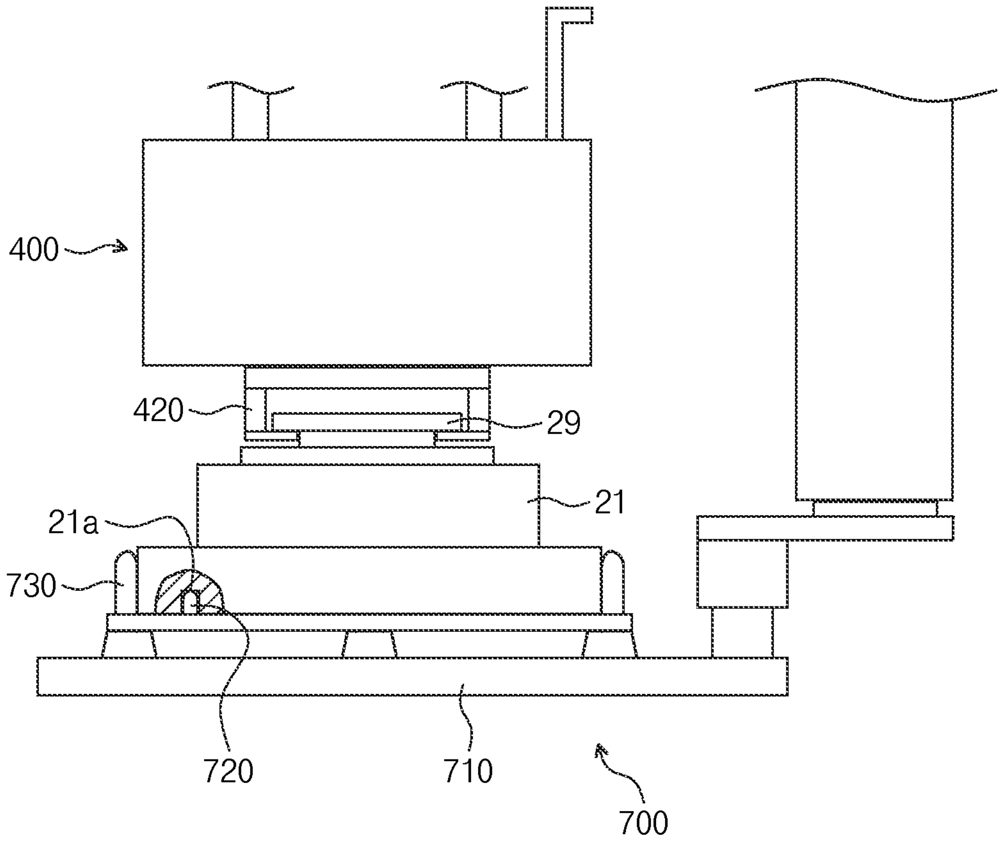

Referring to FIGS. 7A and 7B, the height difference between the second support pins 730 and the first support pins 720 may avoid interference with the first support pins 720 when the second article (or third article) 22 is supported on the second support pins 730. The second support pins 730 may be disposed outwardly from the first support pins 720 relative to a predetermined center of the plate 710. The second article 22 and the third article 23 have pin recesses **22*a* and 23*a* on their undersides into which the second support pins 730 are inserted. Referring to FIG. 7C, the first article 21 has pin recesses 21*a* into which the first support pins 720** are inserted, on the bottom surface.

Figure 8:
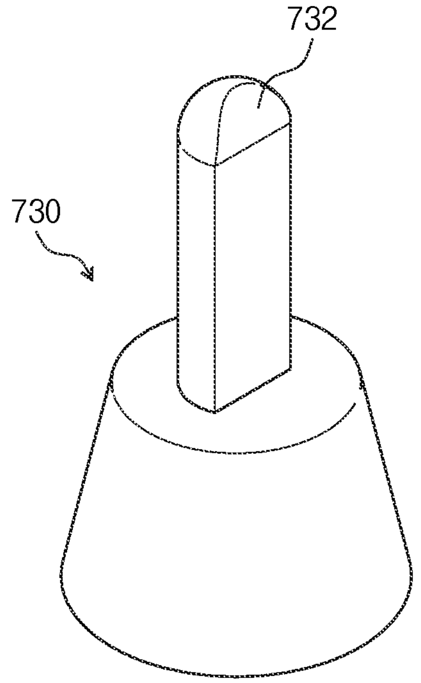
FIG. 8 is a diagram for illustrating a second support pin.

FIG. 8 is a diagram illustrating the second support pin.

As illustrated in FIG. 8, the second support pin 730 has an inclined surface 732. When the first article 21 is coupled to the first support pins 720, the first article 2 may be aligned by the inclined surfaces 732 of the second support pins 730.

Referring again to FIGS. 2 and 3, the control unit 900 may determine the size of the article 20 by receiving a detection signal from the first detection unit 510. Further, the control unit 900 adjusts the descending height of the hand unit 400 based on the size of the article 20.

Here, a higher-level controller 90 may be an OHT Control System (OCS) that provides integrated control management of a plurality of article transferring apparatuses to be inserted for the purpose of transferring the article in the semiconductor manufacturing process. The higher-level controller 90 receives the transfer instructions from a Manufacturing Control System (MCS), which integrally manages the manufacturing device and logistics system. In order to ensure that the transfer operation is completed in the shortest amount of time, the high-level controller may issue a transfer instruction to the article transferring apparatus to navigate the shortest route from the origin to the destination and select an article transferring apparatus that is optimally positioned to perform the transfer operation. At this time, loading/unloading information of the article is also provided to the control unit 900.

Figure 9A:
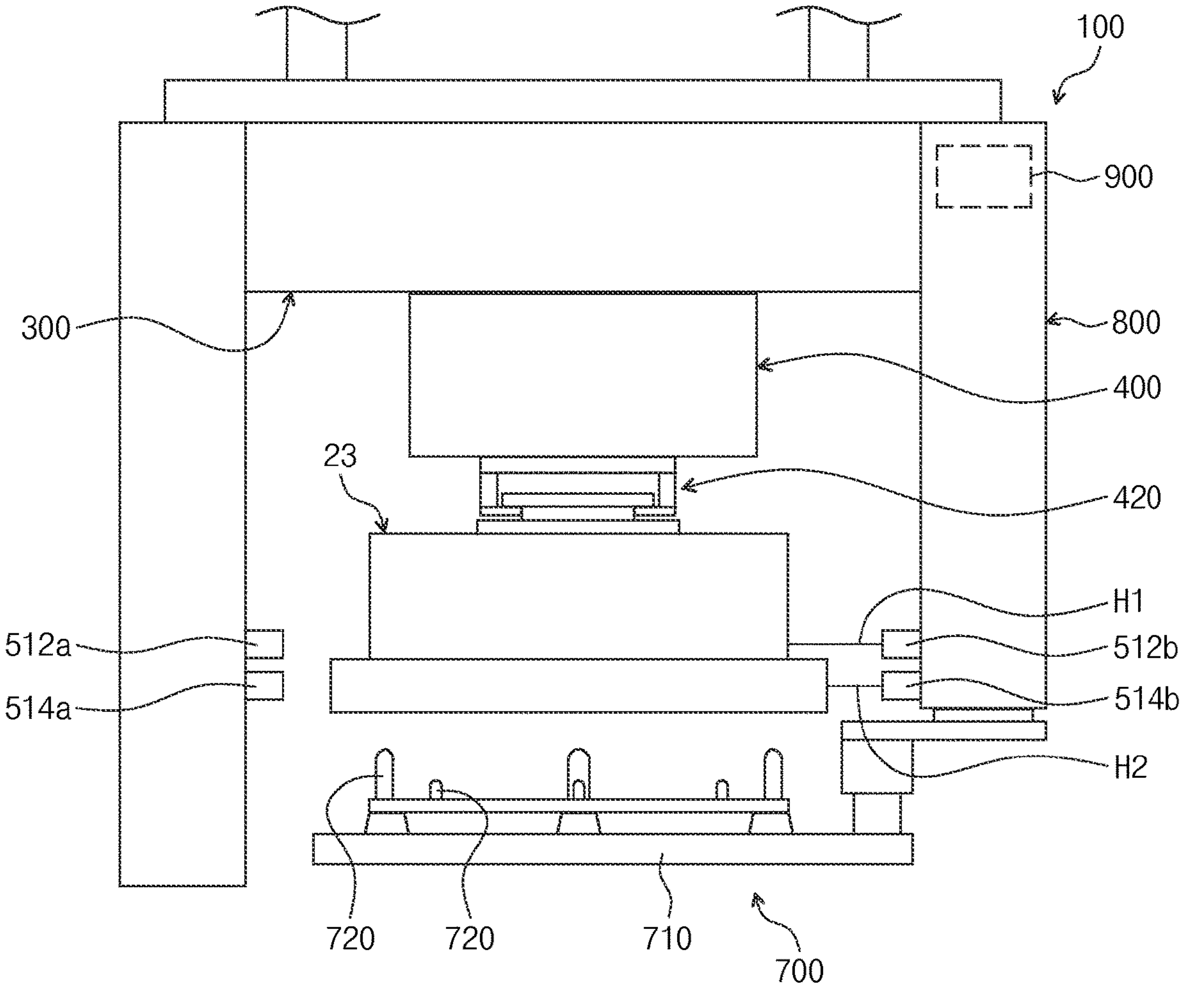
FIGS. 9A to 9C are diagrams for illustrating a first detection unit.
Figure 9B:
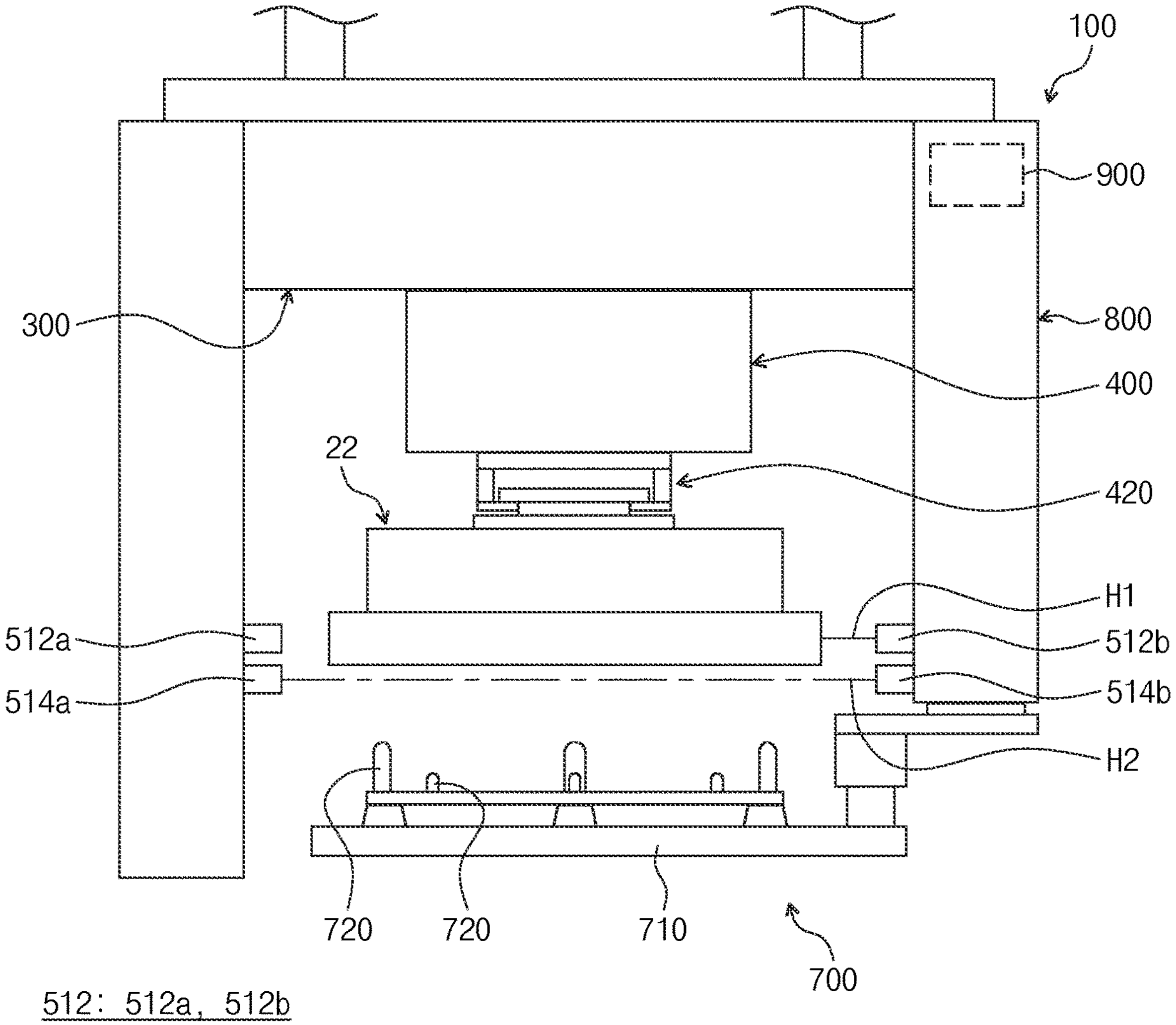
Figure 9C:
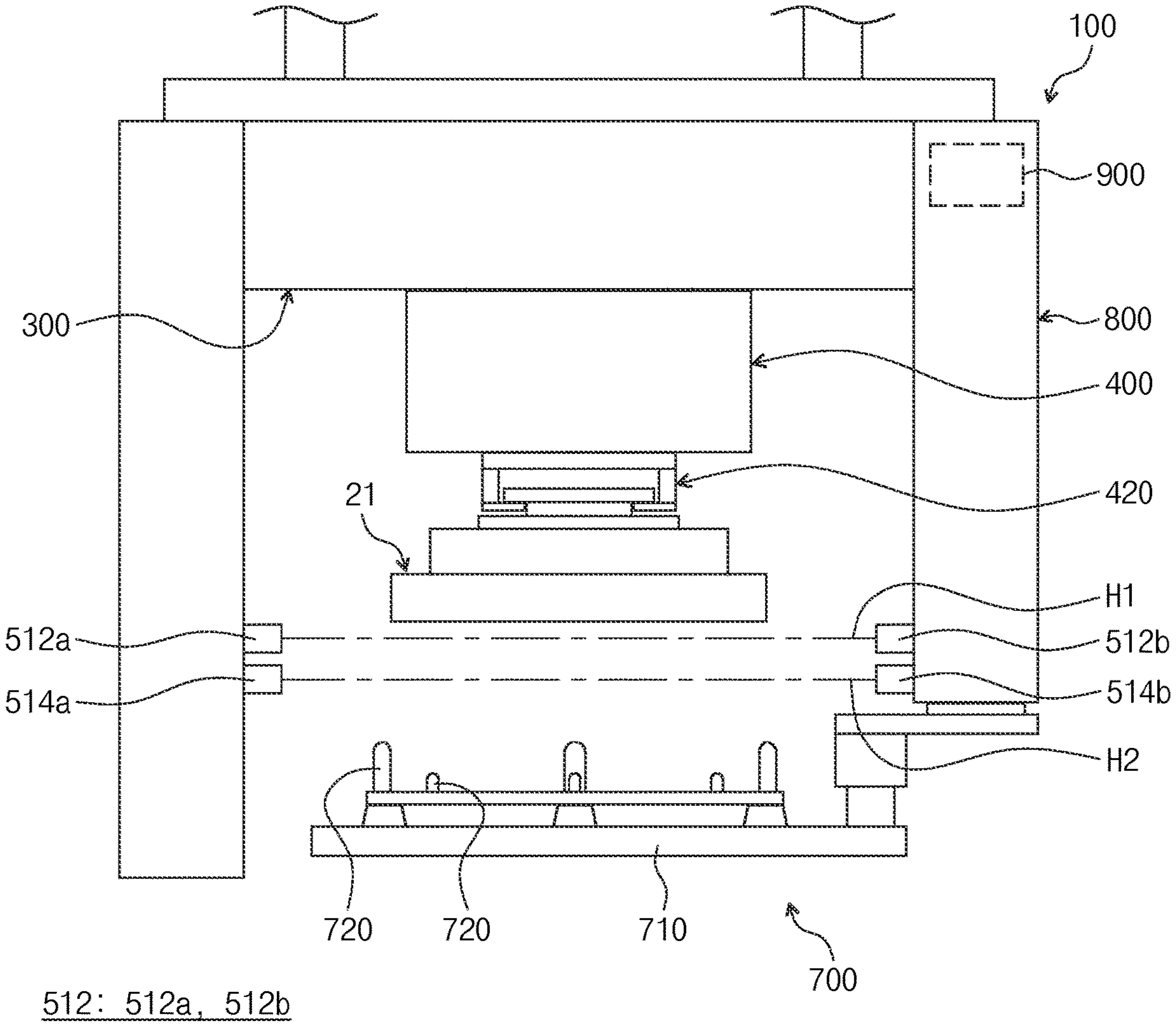

FIGS. 9A to 9C are diagrams for illustrating the first detection unit.

The first detection unit 510 may be installed on an interior side of the vehicle main body 800 to detect the type of articles 21, 22, and 23. The first detection unit 510 detects the articles 21, 22, and 23 in the home position. The home position is where the articles 21, 22, and 23 wait for a short period of time before the hoist module 300 seats the article on the drop preventing member 700. FIG. 9A to FIG. 9C illustrate the articles 21, 22, and 23 at the home position. The first detection unit 510 may include a first sensor 512 for detecting an article at a first height H1 and a second sensor 514 for detecting an article at a second height H2 that is lower than the first height. A detection signal from the first detection unit 510 may be provided to the control unit 900. For example, the first sensor 512 and the second sensor 514 may be on/off sensors. The first sensor 512 and the second sensor 514 have light receiving units 512*a* and 514*a* and light emitting units 512*b* and 514*b*, respectively. The light emitting units 512*b* and 514*b* may be emitters capable of emitting radiation L. The light emitting units 512*b* and 514*b* may include, for example, light emitting diodes (LEDs), infrared emitting diodes (IREDs), lasers, and light bulbs. The light receiving units 512*a* and 514*a* may be detectors that receive radiation emitted by the light emitting units 512*b* and 514*b* and generate and provide a corresponding signal to the control unit 900. For example, the light receiving units 512*a* and 514*a* may include photodiodes, reverse-bias LEDS, Active-Pixel Sensors (APS), Avalanche PhotoDiodes (APDs), Charge-Coupled Devices (CCDs), Photoresistors, Photomultiplier tubes, Photovoltaics, and the like.

The first article 21, the second article 22, and the third article 23 have different sizes (heights). For example, the first sensor 512 is disposed below the first article 21 present at the home position, and the second sensor 514 is disposed below the second article 22 present at the home position. The second sensor 514 is disposed above the third article 23 present at the home position.

The control unit 900 may determine a type of article according to the detection signal from the first detection unit 510.

The control unit 900 determines a type of article as the first article 21 when the first sensor 512 and the second sensor 514 do not detect the article, determines a type of article as the third article 23 when the first sensor 512 and the second sensor 514 detect the article, and determines a type of article as the second article when the first sensor 512 detects the article and the second sensor 514 does not detect the article.

The control unit 900 controls the descending motion of the hoist module 300 such that the lowering distance of the hand unit 400 varies depending on the type of article.

Figure 10A:
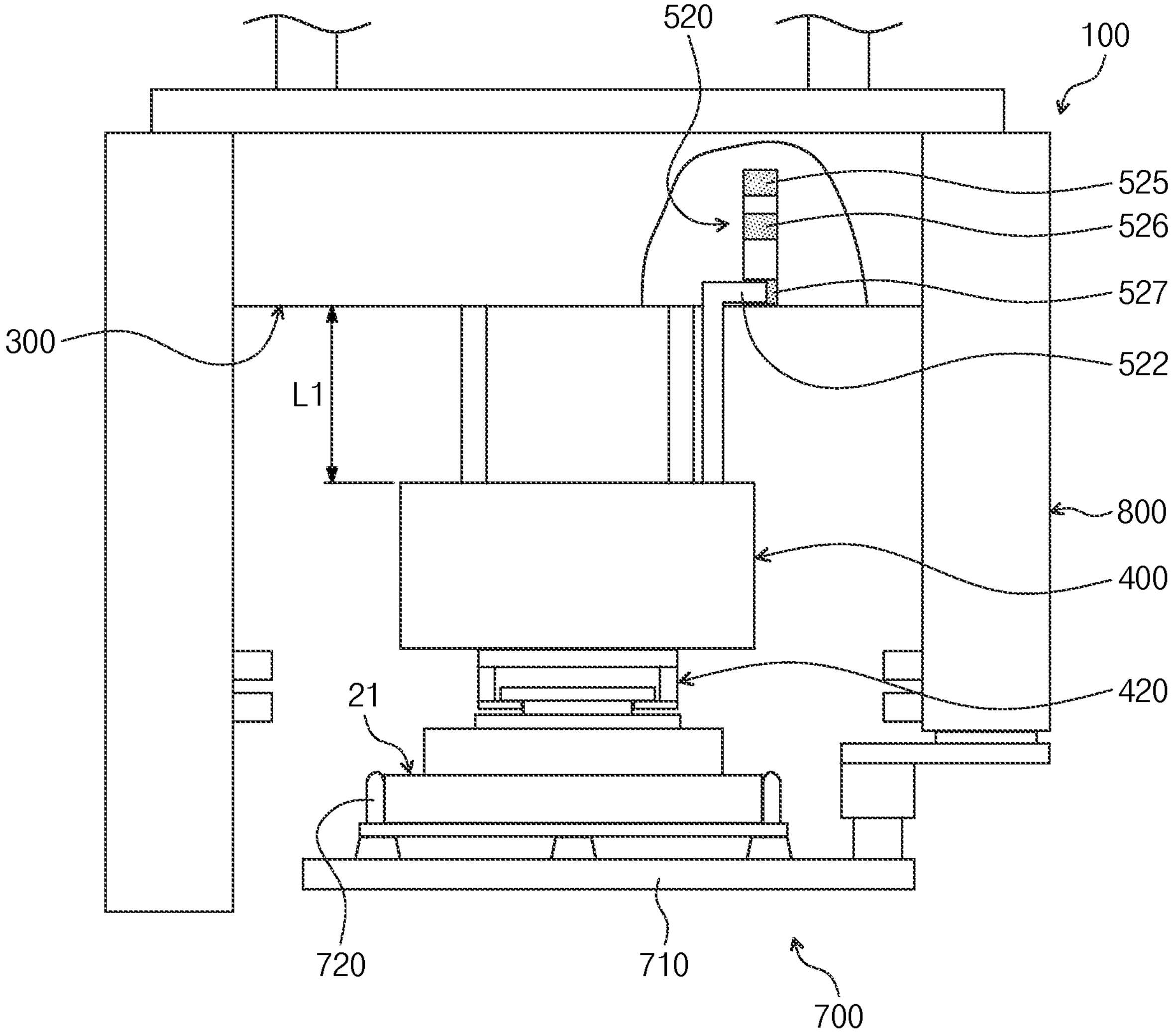
FIGS. 10A to 10C are diagrams for illustrating the state where an article is placed on the drop preventing member.
Figure 10B:
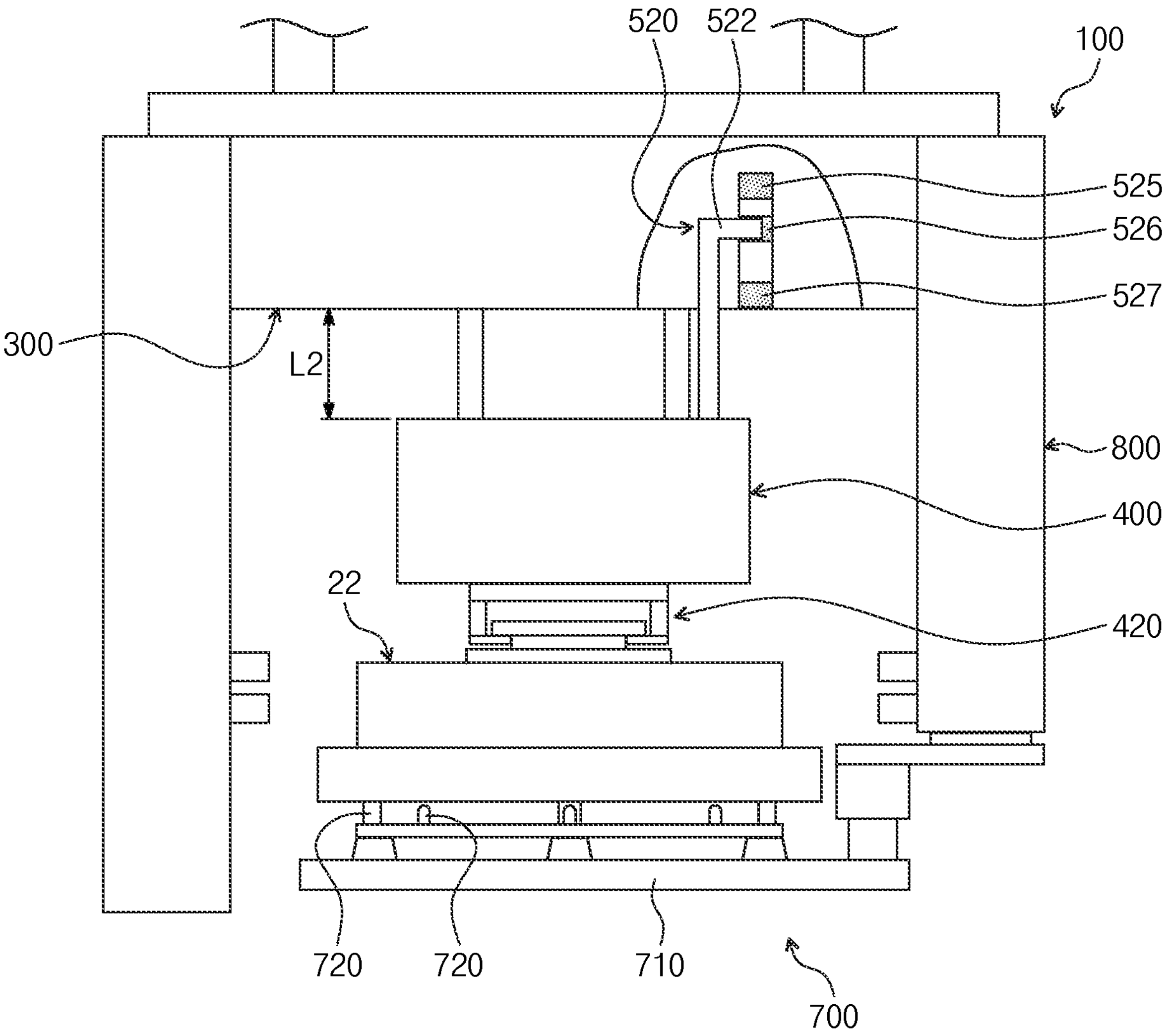
Figure 10C:
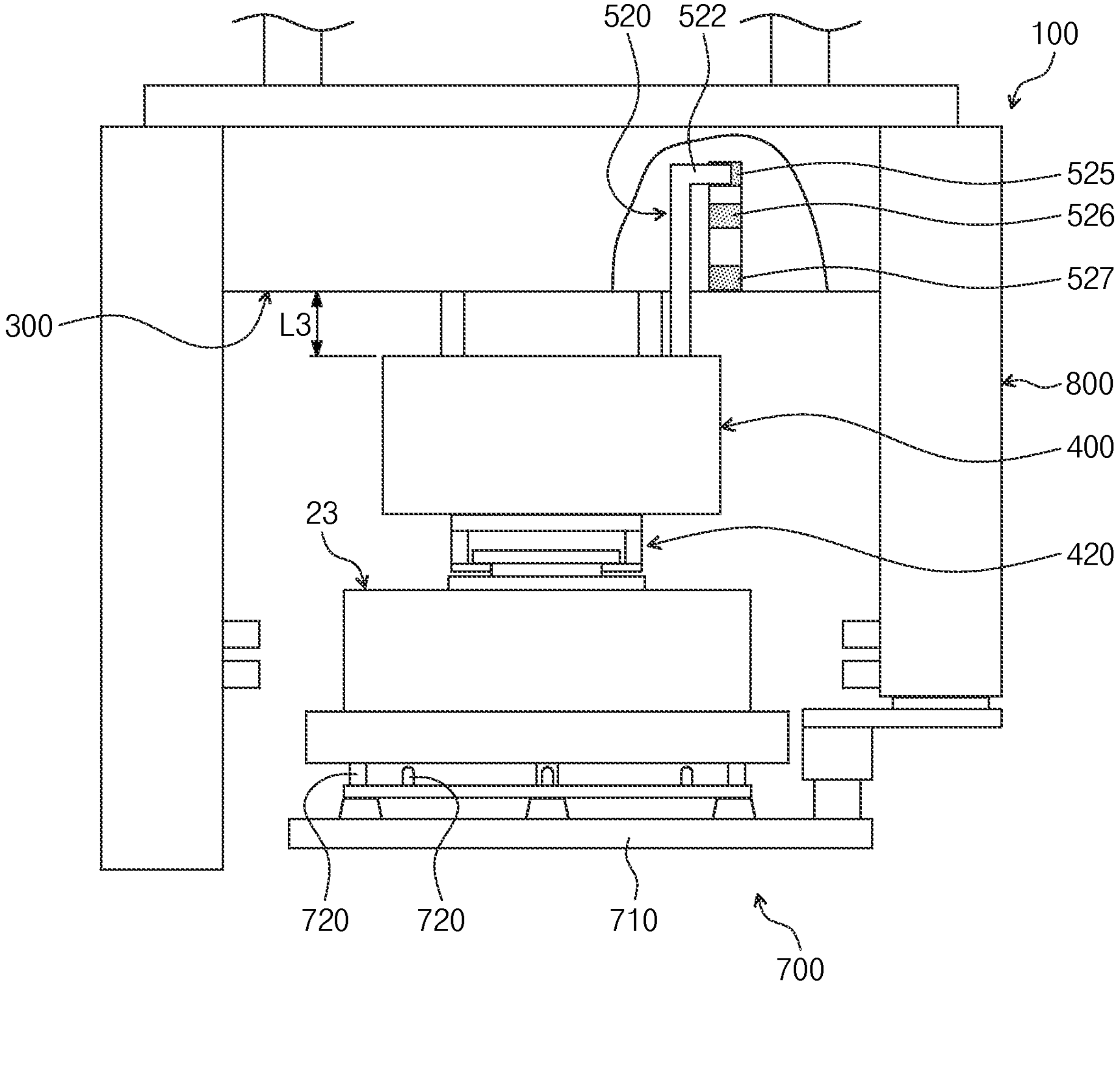

FIGS. 10A to 10C are diagrams for illustrating the state where the article is placed on the drop preventing member.

Referring to FIG. 10A, the hand unit 400 descends by the hoist module 300 by a first height L1 while clamping the first article 21 to place the first article 21 on the drop preventing member 700. Referring to FIG. 10B, the hand unit 400 descends by the hoist module 300 by a second height L2 while clamping the second article to place the second article 22 on the drop preventing member. Referring to FIG. 10C, the hand unit 400 descends by the hoist module 300 by a third height L3 while clamping the third article 23 to place the third article 23 on the drop preventing member 700.

The second detection unit 520 detects a descending height of the hand unit 400 that has been moved from the home position to the support position at which the article is supported on the drop preventing member 700. The second detection unit 520 may include a dog bar 522, and a first sensor 525, a second sensor 526, and a third sensor 527. The dog bar 522 is provided to be moved with the hand unit 400.

The first sensor 525, the second sensor 526, and the third sensor 527 may be installed on the hoist module 300. However, the installation locations of the sensors are not limited thereto, and may also be installed on the vehicle main body 800. The first sensor 525 detects the dog bar 522 when the hand unit 400 is moved by the first height L1 (see FIG. 10A). The second sensor 526 detects the dog bar 522 when the hand unit 400 is moved by the second height L2 (see FIG. 10B). The third sensor 527 detects the dog bar 522 when the hand unit 400 is moved by the third height L3 (see FIG. 10C). For example, when the first sensor 525 does not detect the dog bar 522 after the first article 21 has been moved to the support position, the control unit 900 may determine that the operation is abnormal.

Figure 11:
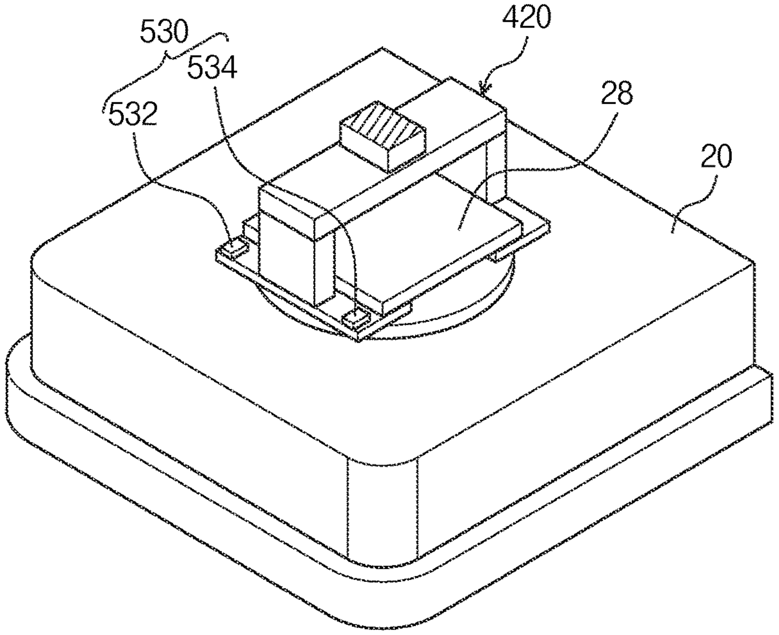
FIGS. 11 and 12 are diagrams for illustrating a third detection unit.
Figure 12:
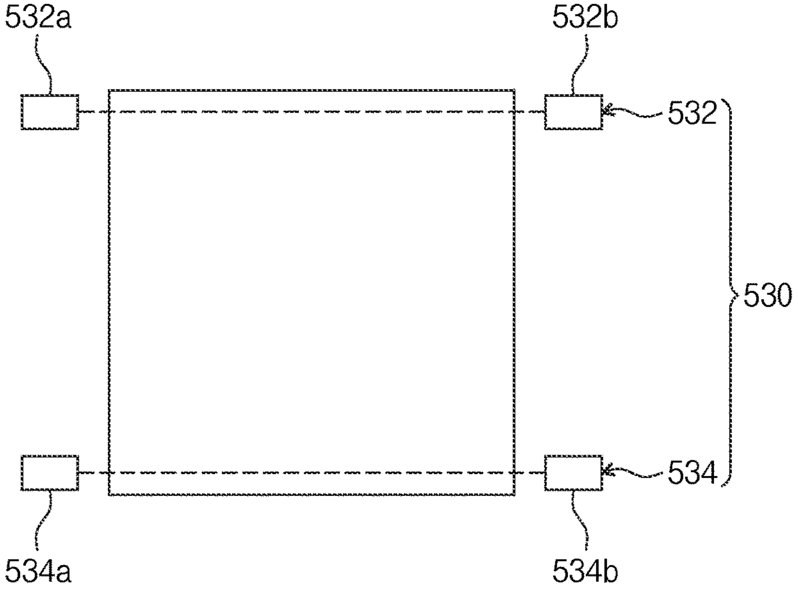

FIGS. 11 and 12 are diagrams for illustrating the third detection unit.

Referring to FIGS. 11 and 12, the third detection unit 530 is installed on the gripper 420. The third detection unit 530 detects whether the gripper 420 of the hand unit is properly gripping the flange 28 of the article 20. The detected information may be provided to the control unit 900. The third detection unit 530 may include a first sensor 532 and a second sensor 534 provided in the same plane. The sensors may be on-off sensors. The first sensor 532 and the second sensor 534 include light receiving units 532*a* and 534*a* and light emitting units 532*b* and 534*b*, respectively. The light emitting units 532*b* and 534*b* may be emitters capable of emitting radiation L. The light emitting units 532*b* and 534*b* may include, for example, light emitting diodes (LEDs), infrared emitting diodes (IREDs), lasers, light bulbs, and the like. The light receiving units 532*a* and 534*a* may be detectors that receive radiation emitted by the light emitting units 532*b* and 534*b* and generate and provide a corresponding signal to the control unit 900. For example, the light receiving units 532*a* and 534*a* may include photodiodes, reverse-bias LEDS, Active-Pixel Sensors (APS), Avalanche PhotoDiodes (APDs), Charge-Coupled Devices (CCDs), Photoresistors, Photomultiplier tubes, Photovoltaics, and the like.

The article transferring apparatus 100 including the configuration as described above may determine the size of the article 20, and may safely place the article from the home position to the support position based on the size of the article.

An article transferring method in the article transferring apparatus of the present invention is as follows.

First, when the hand unit 400 grips the article 20 located in a storage place, the hoist module 300 connected with the hand unit 400 hoists the article 20 to a home position on the vehicle main body 800. The third detection unit 530 detects whether the gripper 420 of the hand unit 400 has properly gripped the flange 28 of the article 20.

In the state where the article 20 is located at the home position on the vehicle main body 800, the drop preventing member 700 is moved to a position to prevent the article 20 from dropping.

The article 20 is then moved from the home position of the vehicle main body 800 to the support position of the drop preventing member 700.

Before the article 20 is placed on the drop preventing member 700, the first detection unit 510 detects the article 20 located at the home position and the control unit 900 determines the type of article 20. The control unit 900 may determine three types of article based on whether the first sensor 512 detecting the article at the first height detects the article and whether the second sensor 514 detecting the article at the second height detects the article.

When the control unit 900 completes the determination of the article, the control unit 900 controls the descending motion of the hoist module 300 such that a descending distance of the hand unit 400 varies depending on the type of article determined. For example, in the case of the first article 21, the hand unit 400 descends by the first height, in the case of the second article 22, the hand unit 400 descends by the second height, and in the case of the third article 23, the hand unit 400 descends by the third height. The second detection unit 520 detects the position of the downwardly moved hand unit 400 (double interlock function). The detection signal from the second detection unit 520 is provided to the control unit 900. Based on the detection signal, the control unit 900 may verify whether the hand unit 400 is in a normal position.

In the foregoing exemplary embodiments, the method is described on the basis of a flow chart as a series of operations or blocks, but the present invention is not limited to the order of operations, and the operations of the present invention may occur in a different order or concurrently with other operations as described above. Further, those skilled in the art will understand that the operations illustrated in the flow chart are not exclusive, and that other operations may be included or one or more operations of the flow chart may be deleted without affecting the scope of the present invention.

The foregoing exemplary embodiments are presented for helping the understanding of the present invention, and do not limit the scope of the present invention, and it should be understood that various modified exemplary embodiments from the foregoing exemplary embodiments are also included in the scope of the present invention. The technical protection scope of the present invention should be determined by the technical spirit of the claims, and it should be understood that the technical protection scope of the present invention is not limited to the literal description of the claims itself, but is substantially equivalent to the technical value.

What is claimed is:

1. An apparatus for transferring an article, the apparatus comprising:

- a vehicle moving along a moving rail installed on a ceiling;
- a main body connected to the vehicle and providing an interior space in which an article is located;
- a hoist module provided in the main body, and for hoisting a belt by winding or unwinding the belt;
- a hand unit fixed at one end of the belt and for gripping the article;
- a drop preventing member provided in the main body, and for preventing the article from dropping during moving of the vehicle;
- a first detection unit provided in the main body and detecting the article; and
- a control unit for determining a type of article according to a detection signal of the first detection unit,
- wherein the drop preventing member includes support pins provided at different heights.

2. The apparatus of claim 1, wherein the drop preventing member further includes a plate on which the support pins are installed, and

- the support pins include:
  - first support pins supporting a first article; and
  - second support pins for supporting a second article and a third article with a larger area than the first article, and
- the first support pins have lower heights than the second support pins.

3. An apparatus for transferring an article, the apparatus comprising:

- a vehicle moving along a moving rail installed on a ceiling;
- a main body connected to the vehicle and providing an interior space in which an article is located;
- a hoist module provided in the main body, and for hoisting a belt by winding or unwinding the belt;
- a hand unit fixed at one end of the belt and for gripping the article;
- a drop preventing member provided in the main body, and for preventing the article from dropping during moving of the vehicle;
- wherein the drop preventing member includes support pins provided at different heights,
- wherein the drop preventing member further includes a plate on which the support pins are installed, and the support pins include:
  - first support pins supporting a first article; and
  - second support pins for supporting a second article and a third article with a larger area than the first article,
  - wherein the first support pins have lower heights than the second support pins, and
  - wherein the second support pins have inclined surfaces that align the first article when the first article is coupled to the first support pins.

4. The apparatus of claim 1, wherein the first detection unit detects the article at a home position where the article waits for a period of time before the hoist module seats the article on the drop preventing member.

5. The apparatus of claim 4, wherein the first detection unit includes:

- a first sensor for detecting the article at a first height;
- a second sensor for detecting the article at a second height lower than the first height, and
- the control unit determines the article as a first article when the first sensor and the second sensor do not detect the article, determines the article as a third article when the first sensor and the second sensor detect the article, and determines the article as a second article when the first sensor detects the article and the second sensor does not detect the article.

6. The apparatus of claim 5, wherein the control unit controls a descending motion of the hoist module so that a descending distance of the hand unit varies depending on the type of article.

7. The apparatus of claim 6, wherein when the article is determined as the first article, the control unit descends the hand unit by a first height, when the article is determined as the second article, the control unit descends the hand unit by a second height, and when the article is determined as the third article, the control unit descends the hand unit by a third height.

8. The apparatus of claim 7, further comprising:

a second detection unit for detecting a descending height of the hand unit, wherein the second detection unit includes:

a dog bar provided to be moved with the hand unit;

a first sensor for detecting the dog bar when the hand unit is moved by the first height;

a second sensor for detecting the dog bar when the hand unit is moved by the second height; and a third sensor for detecting the dog bar when the hand unit is moved by the third height.

9. The apparatus of claim 1, further comprising:

a third detection unit for detecting whether a gripper of the hand unit is gripping a flange of the article.

10. An apparatus for of transferring an article, the apparatus comprising:

a vehicle moving along a moving rail installed on a ceiling;

a main body connected to the vehicle and providing an interior space in which an article is located;

a hoist module provided in the main body, and for hoisting a belt by winding or unwinding the belt;

a hand unit fixed at one end of the belt and for gripping the article; and a drop preventing member provided in the main body, and for preventing the article from dropping during moving of the vehicle;

a first detection unit provided in the main body and for detecting an article; and a control unit for determining a type of article according to a detection signal of the first detection unit, wherein the drop preventing member includes:

a plate positioned in a lower portion of the interior space by a driving unit;

first support pins provided on the plate and supporting a first article; and second support pins provided on the plate, supporting a second article and a third article with a larger area than the first article, and having higher heights than the first support pins, and the first detection unit detects the article at a home position where the article waits for a period of time before the hoist module seats the article on the drop preventing member.

11. The apparatus of claim 10, wherein the second support pins have inclined surfaces that align the first article when the first article is coupled to the first support pins, and the first detection unit includes:

a first sensor for detecting the article at a first height;

a second sensor for detecting the article at a second height lower than the first height, and the control unit determines the article as a first article when the first sensor and the second sensor do not detect the article, determines the article as a third article when the first sensor and the second sensor detect the article, and determines the article as a second article when the first sensor detects the article and the second sensor does not detect the article.

12. The apparatus of claim 11, wherein the control unit controls a descending motion of the hoist module so that a descending distance of the hand unit varies depending on the type of article, and the apparatus further includes:

a second detection unit for detecting a descending height of the hand unit; and a third detection unit for detecting whether a gripper of the hand unit is gripping a flange of the article.

* * * * *